United States Patent
Ikeda

(10) Patent No.: US 10,099,600 B2
(45) Date of Patent: Oct. 16, 2018

(54) STEERING WHEEL SWITCH DEVICE

(71) Applicant: Hitachi Metals, Ltd., Tokyo (JP)

(72) Inventor: Yukio Ikeda, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/424,248

(22) Filed: Feb. 3, 2017

(65) Prior Publication Data

US 2017/0240095 A1    Aug. 24, 2017

(30) Foreign Application Priority Data

Feb. 24, 2016   (JP) ................ 2016-033004

(51) Int. Cl.
| | |
|---|---|
| *H01H 9/00* | (2006.01) |
| *B62D 1/04* | (2006.01) |
| *B60Q 1/00* | (2006.01) |
| *B60Q 5/00* | (2006.01) |
| *H01H 3/00* | (2006.01) |
| *H03K 17/96* | (2006.01) |

(52) U.S. Cl.
CPC .......... *B60Q 1/0082* (2013.01); *B60Q 5/003* (2013.01); *B62D 1/046* (2013.01); *H01H 3/00* (2013.01); *H03K 17/962* (2013.01); *H01H 2003/007* (2013.01); *H01H 2203/008* (2013.01); *H01H 2231/026* (2013.01)

(58) Field of Classification Search
CPC . B60Q 1/0082; B62D 1/046; H01H 2003/007
USPC ......... 200/52 R, 61.27, 61.54, 61.57; 701/36
See application file for complete search history.

(56) References Cited

U.S. PATENT DOCUMENTS

| | | | | |
|---|---|---|---|---|
| 5,453,929 A * | 9/1995 | Stove | ................... | A61B 5/18 340/571 |
| 5,808,374 A * | 9/1998 | Miller | ................... | B60K 35/00 200/61.54 |
| 5,855,144 A * | 1/1999 | Parada | ................... | B60K 37/06 200/61.54 |
| 5,969,616 A * | 10/1999 | Tschoi | ................... | B60K 28/066 180/272 |
| 7,242,112 B2 * | 7/2007 | Wolf | ................... | B60R 16/0232 307/112 |
| 8,700,262 B2 * | 4/2014 | Boissonnier | ........... | B62D 1/046 701/36 |
| 8,983,732 B2 | 3/2015 | Lisseman et al. | | |
| 8,994,665 B1 * | 3/2015 | Provancher | ............. | G06F 3/016 345/173 |
| 2011/0246028 A1 | 10/2011 | Lisseman et al. | | |

* cited by examiner

*Primary Examiner* — Vanessa Girardi
(74) *Attorney, Agent, or Firm* — McGinn I.P. Law Group, PLLC.

(57) ABSTRACT

A steering switch device, which is mounted on a steering wheel, includes a linear switch that includes a hollow insulator having restorability and two electrode wires arranged spirally along an inner surface of a hollow part in the hollow insulator while being kept not in contact with each other, wherein a winding pitch coiling spirally the electrode wires is at least not more than 10 mm, and a detecting device that detects a press of the linear switch by sensing a contact of the electrode wires. The linear switch is arranged so as to be along at least part of a surface of the steering wheel.

20 Claims, 9 Drawing Sheets

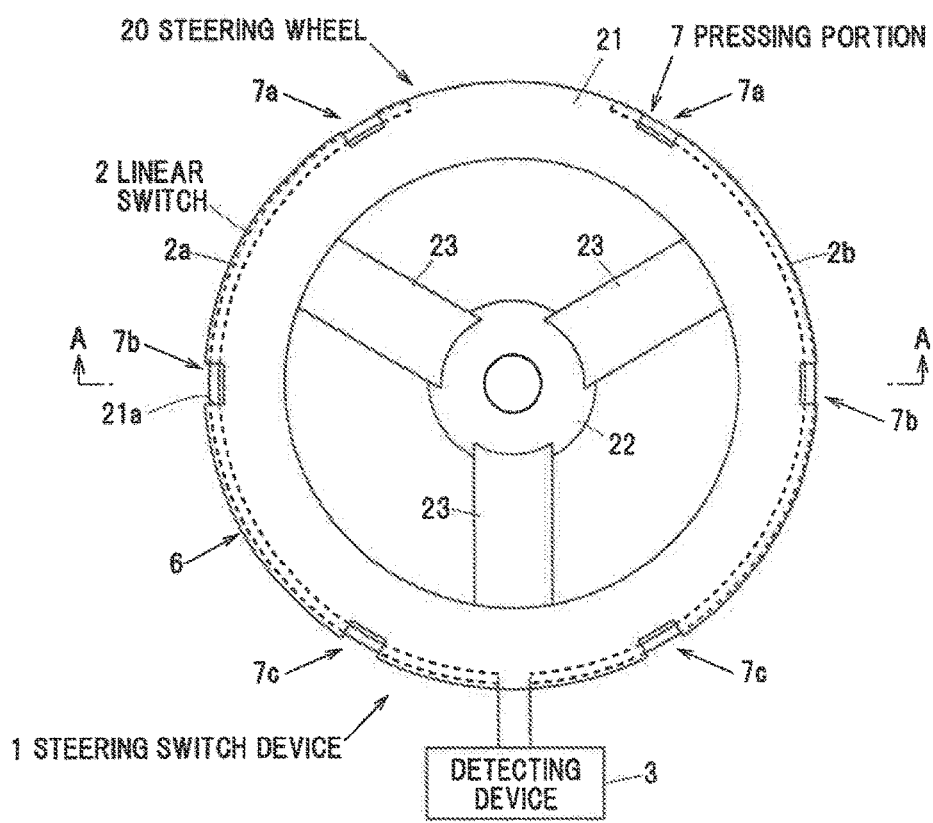
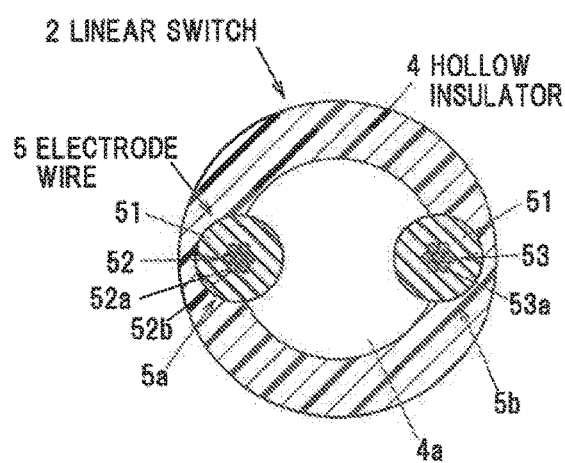
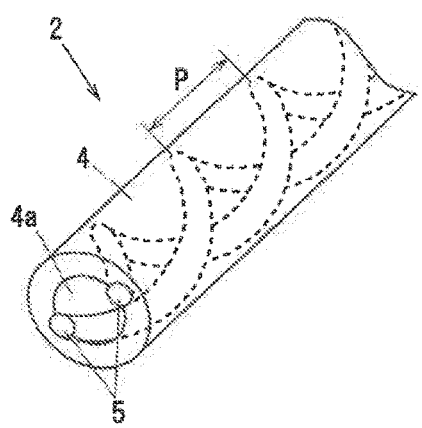

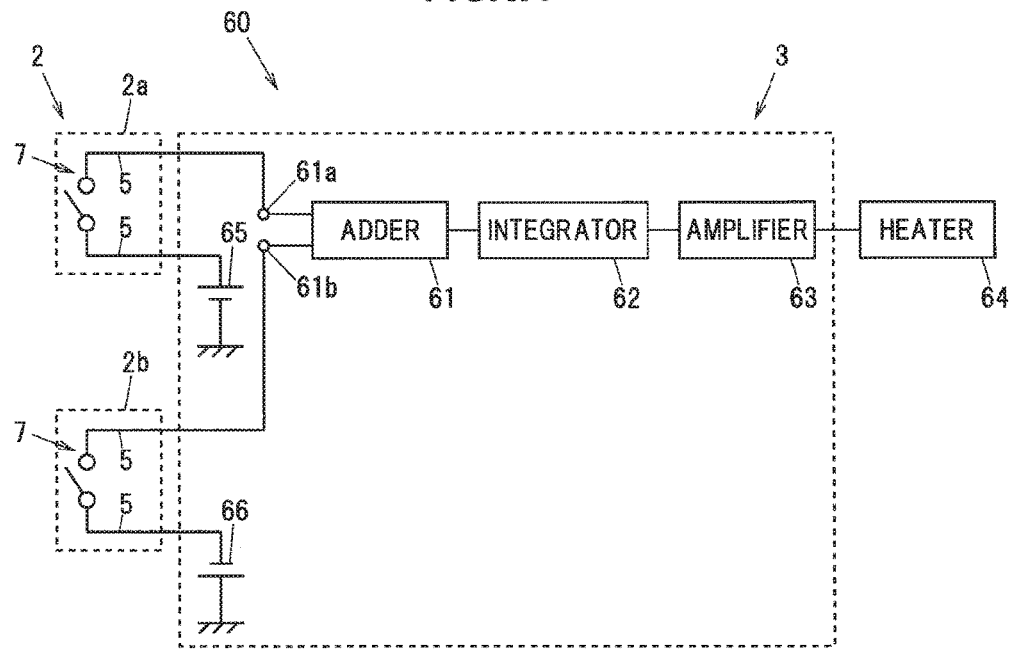
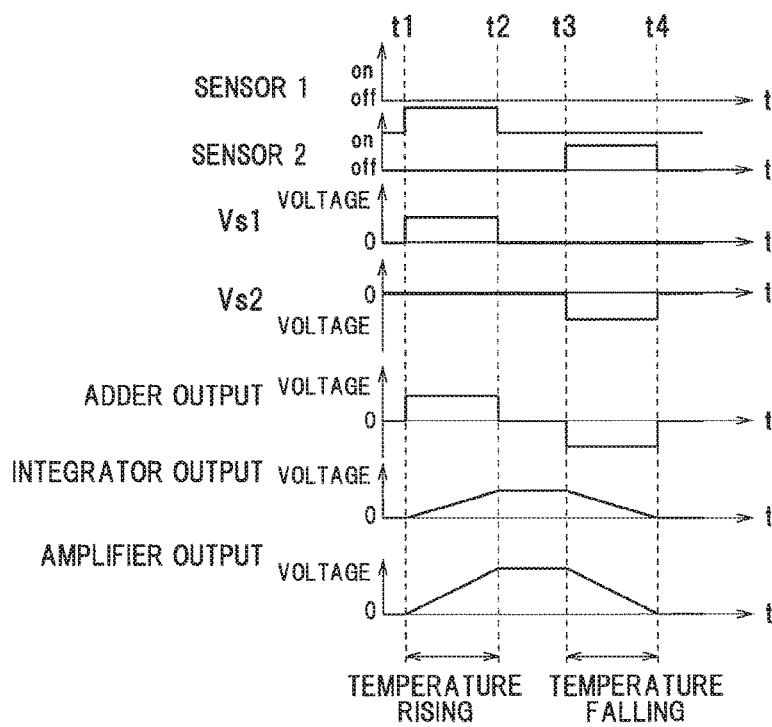

STEERING WHEEL SWITCH DEVICE

The present application is based on Japanese patent application No. 2016-033004 filed on Feb. 24, 2016, the entire contents of which are incorporated herein by reference.

BACKGROUND OF THE INVENTION

1. Field of the Invention

This invention relates to a steering switch device and a steering wheel with the steering switch device mounted thereon.

2. Description of the Related Art

Recently, a vehicle steering wheel mounts various switches such as an audio operation switch, an air-conditioner operation switch and a cruise control switch.

A push switch which uses a rubber contact or a spring etc. is widely used as a steering switch device mounted on the steering wheel.

SUMMARY OF THE INVENTION

Along with the increased number of switches mounted on the steering wheel, the steering switch device using the push switch may have some problems such as complicated structure and increased failure rate which are caused by the increased switches.

U.S.-A-20110246028 discloses a steering switch device which mounts a pressure sensor in the steering wheel. However, the steering switch device may have some problem such as low versatility and low mass-productivity since the steering switch device needs to use a dedicated pressure sensor which is suited to a shape of the steering wheel to which the steering switch device is applied or an area to perform as the switch.

It is an object of the invention to provide a steering switch device that meets simple configuration, low failure rate, high versatility and mass-productivity, as well as a steering wheel using the steering switch device.

(1) According to an embodiment of the invention, a steering switch device, which is mounted on a steering wheel, comprises:

a linear switch that comprises a hollow insulator having restorability and two electrode wires arranged spirally along an inner surface of a hollow part in the hollow insulator while being kept not in contact with each other, wherein a winding pitch coiling spirally the electrode wires is at least not more than 10 mm; and a detecting device that detects a press of the linear switch by sensing a contact of the electrode wires, wherein the linear switch is arranged so as to be along at least part of a surface of the steering wheel.

According to another embodiment of the invention, a steering wheel comprises the steering switch device according to the above embodiment (1).

Effects of the Invention

According to an embodiment of the invention, a steering switch device can be provided that meets simple configuration, low failure rate, high versatility and mass-productivity, as well as a steering wheel using the steering switch device.

BRIEF DESCRIPTION OF THE DRAWINGS

Next, the present invention will be explained in conjunction with appended drawings, wherein:

FIG. 1A is a plan view showing a steering wheel that mounts a steering switch device wheel in an embodiment according to the invention;

FIG. 1B is a cross sectional view showing a linear switch;

FIG. 1C is a perspective view showing the linear switch;

FIG. 6A is an explanatory diagram showing a schematic configuration of a steering switch device in a modification according to the invention;

FIG. 6B is a graph chart showing output of each members using time chart;

DETAILED DESCRIPTION OF THE PREFERRED EMBODIMENTS

The Embodiment

Next, an embodiment according to the invention will be described below with the reference to accompanying views.

Figure 2:
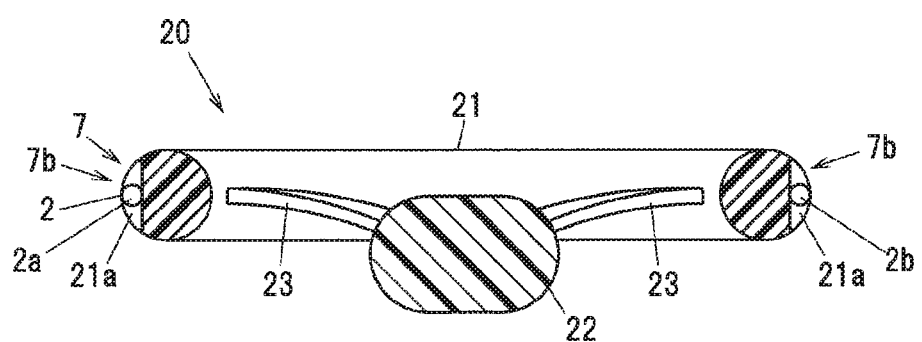
FIG. 2 is a cross sectional view cut along a line A-A in FIG. 1A.

FIG. 1A is a plan view showing a steering wheel that mounts a steering switch device wheel in an embodiment according to the invention. FIG. 1B is a cross sectional view showing a linear switch. FIG. 1C is a perspective view showing a linear switch. FIG. 2 is a cross sectional view showing FIG. 1A along line A-A.

As shown in FIG. 1A to FIG. 2, a steering switch device 1 is a switch device mounted on a steering wheel 20. The steering wheel 20 is provided with a nearly annular steering wheel main body 21, a coupling portion 22 that is arranged on a central axis of the steering wheel main body 21 and coupled with a steering shaft (not shown), and a spoke portion 23 that is arranged between the coupling portion 22 and the steering wheel main body 21. Meanwhile, a specific shape of the steering wheel 20 is not limited to be shown.

The steering switch device 1 is provided with a linear switch 2 that is arranged along at least part of a surface of the steering wheel 20, and a detecting device 3.

The linear switch 2 is provided with a restorable hollow insulator 4, and two electrode wires 5 arranged spirally along an inner surface of a hollow portion 4a of a hollow insulator 4 with the electrode wires 5 keeping non-contact each other.

The hollow insulator 4 is made of restorable rubber or restorable plastic, holds the two electrode wires 5 spirally without contacting electrically, transforms easily caused by an external force, and restores immediately when the external force disappears.

As the restorable rubber used for the hollow insulator 4, for example, urethane rubber, silicone rubber, ethylene-propylene rubber, styrene-butadiene rubber, and chloroprene rubber are listed. Also, as the restorable plastic used for the hollow insulator 4, for example, poly-ethylene, ethylene-vinyl acetate copolymer, ethylene-ethyl-acrylate copolymer, ethylene-methyl-methacrylate copolymer, polypropylene, polyvinyl chloride, and olefin or styrene thermal plastically elastomers are listed. Moreover, engineering plastics such as polyimide or polyamide can use as the restorable plastic by devising form, thickness or laminating with other materials. In the present embodiment, the hollow insulator 4 that is made of silicone rubber is used.

The electrode wire 5 is, at least an outermost layer of the electrode wire 5 is, formed by a conductive layer 51 which is made of the conductive rubber or the conductive plastic. The conductive rubber or the conductive plastic used for a hollow insulator 4 in which conductive filler material such as carbon black is combined can be used as the conductive rubber or the conductive plastic used for the conductive layer 51. In this case, Silicone rubber in which the carbon black is combined is used as the conductive layer 51.

A hardness of the conductive layer 51 (the shore A hardness) is preferable to be not less than 20 and not more than 80. If the hardness of the conductive layer 51 (the shore A hardness) is less than 20, a mechanical strength of the conductive layer 51 decrease and it is likely to generate a fault such as disconnection. Meanwhile, if the hardness of the conductive layer 51 (the shore A hardness) is more than 80, flexibility of whole linear switch 2 decreases and it is likely hard to push the linear switch 2.

In the present embodiment, at least one of the two electrode wires 5 fails to have a conductor to conduct electrically with the conductive layer 51 in an inside layer of the conductive layer 51. The detail will be described below, in the present embodiment, a position where the linear switch is pressed is detected by changing in a resistance value between each end of the two electrode wires 5, if both the electrode wires 5 have the conductor, since the resistance value is nearly the same wherever the linear switch 2 is pressed, it is hard to detect the position where the linear switch 2 is pressed. At least one of the two electrode wires 5 not having the conductor to conduct electrically with the conductive layer 2, the resistance value between each end of the two electrode wires 5 changes corresponding to the position where the linear switch 2 is pressed caused by an effect of a resistance of the conductive rubber or the conductive plastic, which configures the conductive layer 51 and the position where the linear switch 2 is pressed can be detected based on the change in the resistance value.

The resistivity of the conductive layer 51 is preferable to be not less than 20 Ω·cm and not more than 500 Ω·cm. If the resistivity of the conductive layer 51 is less than 20 Ω·cm, the change in the resistance value corresponding to the position where the linear switch 2 is pressed is low and an accuracy of detecting the position where the linear switch 2 is pressed is possibly to decrease. And if the resistivity of the conductive layer 51 is more than 500 Ω·cm, the resistance value between the electrode wires 5 becomes too large and the accuracy of detecting the position where the linear switch 2 is pressed is possibly to decrease especially when the linear switch 2 is long.

In the present embodiment, one of the two electrode wires 5 forms the conductive layer 51 on an outer periphery of the enameled wire 52, and the other one of the two electrode wires 5 forms the conductive layer 51 on an outer periphery of the conductor 53. Below, one of the two electrode wires 5 which forms the conductive layer 51 on the outer periphery of the enameled wire 52 defines the first electrode wire 5a and the other one of the two electrode wires 5 which forms the conductive layer 51 on the outer periphery of the conductor 53 defines the second electrode wire 5b.

The enameled wire 52 is formed by covering an outer periphery of a conductor 52a which is made of such as copper with an insulated layer 52b by coating and baking enameled coat. In this case, the first electrode wire 5a is formed by stranding seven small diameter enameled wires 52 and forming the conductive layer 51 around the enameled wires 52 by extrusion coating. The first electrode wire 5a insulates between the conductor 52a of the enameled wire 52a and the conductive layer 51 of the enameled wire 52a.

Also, in the present embodiment, the second electrode wire 5b is formed by extrusion coating the conductive layer 51 around the conductor 53 which is formed by stranding seven wires which is made of such as copper. The conductor 53 and the conductive layer 51 are conducted electrically in the second electrode wire 5b.

Figure 3A:
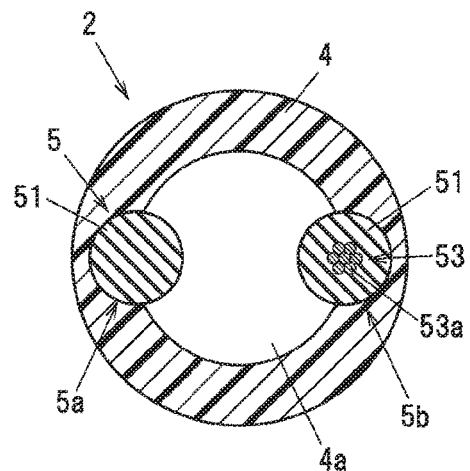
FIG. 3A is a cross sectional view showing a linear switch in a modification according to the invention.
Figure 3B:
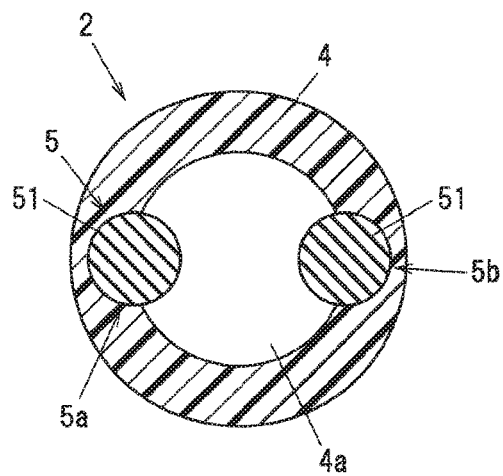
FIG. 3B is a cross sectional view showing a linear switch in a modification according to the invention.
Figure 3C:
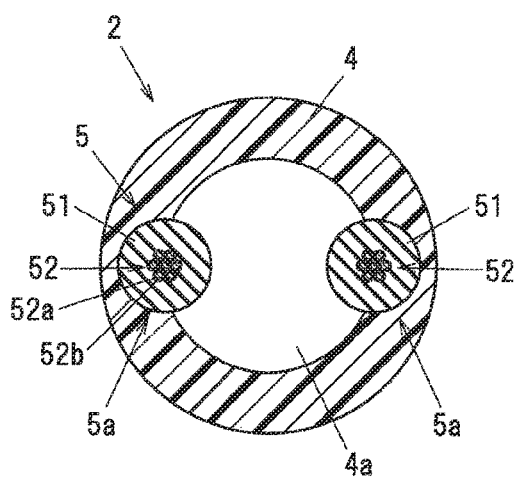
FIG. 3C is a cross sectional view showing a linear switch in a modification according to the invention.

Meanwhile, the specific configuration of the two electrode wires 5 are not limited to thereof, for example, as shown in FIG. 3A, the first electrode wire 5a may be provided with only the conductive layer 51 without the enameled wire 52, as shown in FIG. 3B, additionally, the second electrode wire 5b may be provided with only the conductive layer 51 without the conductor 53. Also, as shown in FIG. 3C, both of the two electrode wires 5 can use the first electrode wire 5a which the conductive layer 51 is formed on the outer periphery of the enameled wire 52. Moreover, as shown in FIG. 3D, a linear object 54 which is made of an insulator such as glass fiber, cotton yarn, carbon fiber or any other super engineering plastic such as polyphenylene sulfide can be used instead of the enameled wire 52 in the first electrode wire 5a.

However, when the electrode wire 5 is provided with only the conductive layer 51 as shown in FIGS. 3A, 3B, since the conductive rubber or the conductive plastic, which configures the conductive layer 51 has low strength, the electrode wire 5 is hard to make longer. That is, for example, it is hard to make long linear switch 2 and cutout the linear switch 2 to intended length and the mass-productivity is possibly to decrease. Thus, from the view to be available to make the long linear switch 2 and improve the mass-productivity, the configuration of the electrode wire 5 is preferable to arrange the conductive layer 51 around the core material such as the enameled wire 52, the conductor 53, and the linear object 54.

Also, as shown in FIG. 3C, if both the electrode wires 5 fail to include the conductor 53, according to the length of the used linear switch 2 or the resistivity of the conductive layer 51, since the resistance value between each end of the two electrode wires 5 becomes too large and the steering switch device 1 is possibly not to detect accuracy the place where the linear switch 2 is pressed. Thus, considering with the length of the used linear switch 2, one of the two electrode wire 5 should form the conductive layer 51 around the conductor 53 as shown in FIG. 1B when the resistance value between each end of the two electrode wires 5 becomes too large.

Figure 3D:
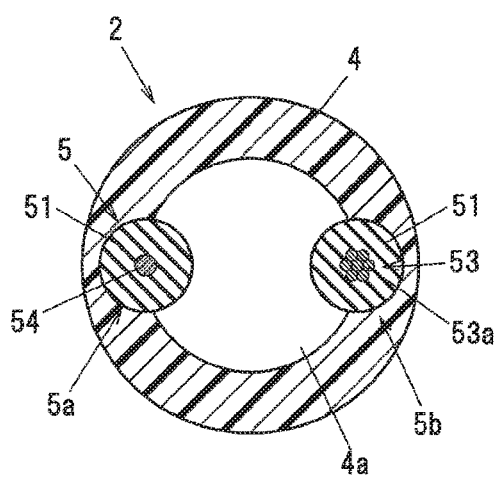
FIG. 3D is a cross sectional view showing a linear switch in a modification according to the invention.

Moreover, when the linear object 54 which is made of insulator as shown in FIG. 3D, since a difference of bending characteristics between the first electrode wire 5a for which the linear object 54 is used and the second electrode wire 5b which the conductor 53 is used, a direction which is hard to bend the linear switch or a difference of the detecting accuracy in the longitudinal direction of the linear switch 2 is possibly to be generated. Thus, if the conductor 53 is used for one of the electrode wires 5, it is preferable to use the enameled wire 52 as a core material for the other electrode wire 5 and prevent from generating the difference of the bending characteristic between the two electrode wires 5. Meanwhile, an outer diameter of a wire 53a in the conductor 53 and an outer diameter of the enameled wire 52 are preferable to be nearly the same. Also, a number of the wire 53a used for the conductor 53 and a number of the enameled wire 52 are preferable to be the same. In this case, the wire 53a and the enameled wire 52, which cross sectional areas are 0.102 mm² are used.

Also, in the steering switch device 1 according to the present embodiment, a winding pitch P which the electrode wires 5 are winded spirally on the linear switch 2 is at least not more than 10 mm. In the steering switch device 1, although a driver pushes the linear switch 2 using the driver's finger, to contact the two electrode wires 5 when the finger pushes the linear switch 2, the winding pitch P between the electrode wires needs to set at least not more than 10 mm. To certainly contact the two electrode wires 5 when the driver pushes the linear switch 2 by the driver's finger, it is more preferable to set the winding pitch P between the electrode wires not more than 5 mm. Meanwhile, the winding pitch P between the electrode wires 5 means a distance along a longitudinal distance from any position to the same position after going around the inner surface of the hollow insulator in the circumferential direction, that is, a pitch between the two electrode wires 5 in the longitudinal direction at any position in the circumferential direction.

The linear switch 2 is arranged so as to be along at least part of a surface of the steering wheel 20. Meanwhile, the linear switch 2 fails to need to contact directly on the surface of the steering wheel 20 (the outer surface), and the linear switch 2 may be arranged so as to be buried inside the surface of the steering wheel 20, or may be arranged so as to project from the surface of the steering wheel 20.

In the steering switch device 1, the linear switch 2 is arranged along a circumferential direction of the steering wheel main body 21 so as to be along at least part of the surface of the steering wheel main body 21. In the present embodiment, the linear switch 2 is arranged so as to be along an outer peripheral surface of the steering wheel main body 21 (an outermost surface in an outer surface of the steering wheel main body 21).

Also, in the present embodiment, using the two linear switches 2a, 2b, one of the linear switches 2a is arranged so as to be along an outer periphery in a left half of the steering wheel main body 21 and the other one of the linear switches 2b is arranged so as to be along an outer periphery in a right half of the steering wheel main body 21.

Meanwhile, the left half and the right half in this embodiment means a left section and a right section from the central axis in bilateral when the steering wheel 20 is set in a reference position (straight position).

Meanwhile, it is not limited to the example shown in above, for example, one linear switch 2 can be arranged so as to be along whole circumference of the steering wheel main body 21. However, in this case, since the totally length of the linear switch 2 become long, the conductive layer 51 in the linear switch 2 needs to be set the resistivity low, hereby the accuracy of detecting the position where the linear switch is pressed is possibly to decrease. Using a plurality of the linear switches 2 and arranging the plurality of the linear switches 2 at different positions separately, the length of each linear switches can be short, hereby the conductive layer in the linear switch 2 can set the resistivity large, and the accuracy of detecting the position where the linear switch 2 is pressed can increase. As a result, an interval between the pressing portions 7 described below can be short and a number of the pressing portions 7 can increase.

The steering switch device 1 is provided with a sensor cover 6 having rigidness, which covers the linear switch 2. In the present embodiment, the steering switch device 1 is configured so as to bury the linear switch 2 in the steering wheel main body 21, and part of a resin member which configures the steering wheel main body 21 performs as the sensor cover 6. Meanwhile, it is not limited to thereof, the sensor cover 6 may be configured separately from the steering wheel 20 and configured such that the sensor cover 6 is set to the steering wheel 20. Also, part of the steering cover (handle cover) which covers the steering wheel main body 21 can be configured so as to perform as the sensor cover 6.

A plurality of pressing portions 7 which can press the linear switch 2 are formed separately on the sensor cover 6 in the longitudinal direction of the linear switch 2. In this case, by forming a cutout portion 21a on the outer peripheral portion of the steering wheel main body 21, the pressing portion 7 is formed so as to expose the linear switch 2 from the cutout portion 21a. A width of the cutout portion 21a is preferable to be not less than 10 mm such that the driver can press the linear switch 2 by the finger.

Meanwhile, the specifically detail of the pressing portion 7 is not limited to be described above, for example, the pressing portion 7 may be configured so as to arrange a member having flexibility (a member which can be pressed by the finger) in part of the sensor cover 6. Also, the pressing portion 7 may be configured so as to arrange a push switch portion which is made of rubber etc. in the sensor cover 6 and may be configured such that the linear switch 2 is pressed indirectly by the member which configures the push switch portion.

In this case, the three pressing portions 7 are formed respectively in the two linear switches 2, though the number of the pressing portion 7 is not limited to. Below, the pressing portion 7 which is arranged at furthest position from the detecting device 3 defines the first pressing portion 7a, the pressing portion 7 which is arranged at the nearest position from the detecting device 3 defines the third pressing portion 7c, and the pressing portion 7 which is arranged at between the first pressing portion 7a and the third pressing portion 7c defines the second pressing portion 7b.

The detecting device 3 detects that the linear switch 2 is pressed by detecting the contact of the electrode wires 5. In the present embodiment, the detecting device 3 is configured so as to detect the change in the resistance value between each end of the two electrode wires 5 at one end of the linear switch 2, and detect the position where the linear switch 2 is pressed (which pressing portion 7a to 7c is pressed) in the longitudinal direction of the linear switch 2 based on the change in the resistance value. The detecting device 3 may be mounted in, for example, an electrical control unit (ECU) for vehicle.

Figure 4:
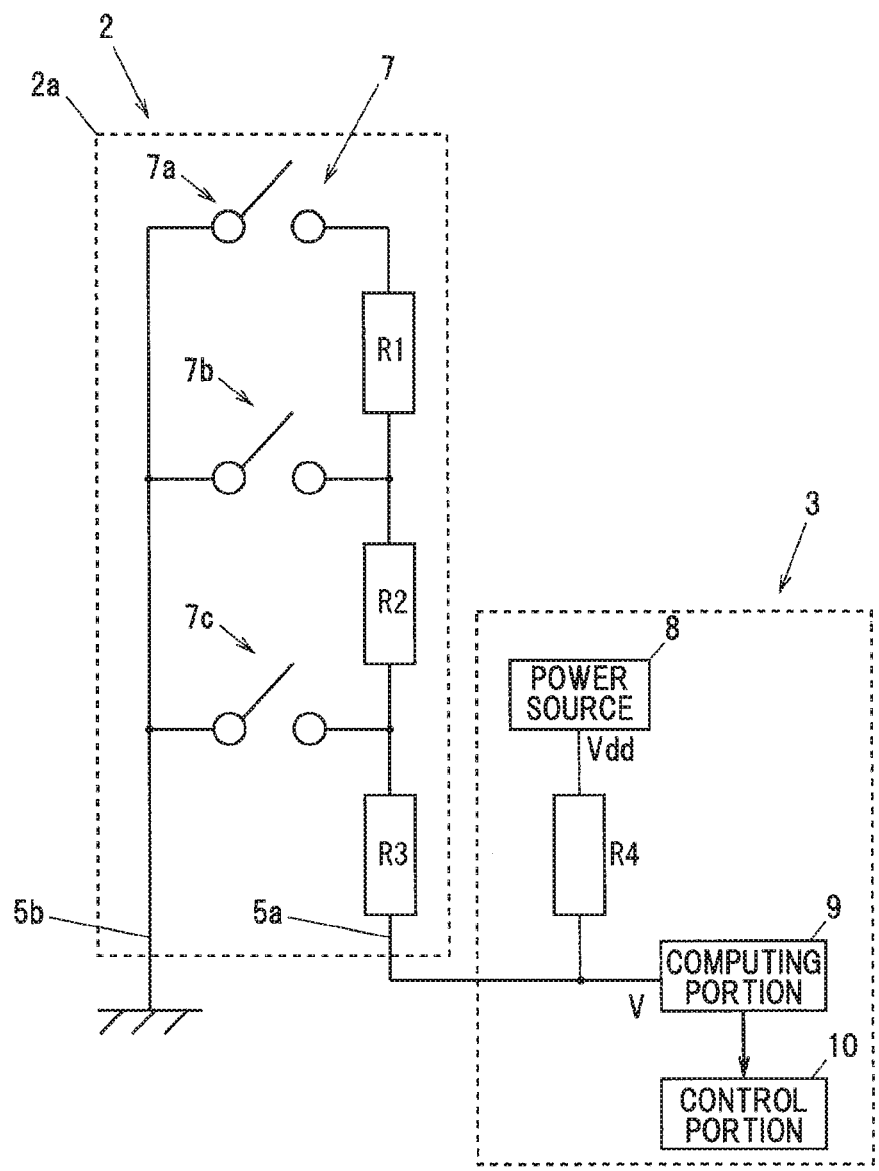
FIG. 4 is an explanatory diagram showing a detecting device.

As shown in FIG. 4, in the present embodiment, the second electrode wire 5b is grounded at one end of the linear switch 2. Also, in the present embodiment, two electrode wires 5 fail to connect electrically at the other end of the linear switch 2 and the other end of the electrode wire 5 is opened.

The detecting device 3 is provided with a power source 8 (direct current power source) which connects to the end of the first electrode wire 5 via a predetermined resistance R4 in one end of the linear switch 2 and apply a predetermined voltage Vdd, a computing portion 9 which detects the change in the resistance value between both ends of the electrode wires 5 by detecting voltage at the end of the one of the electrode wires 5 and detects which pressing portion 7 is pressed, and a control portion 10 to carry out an operation which corresponds to the pressed pressing portion 7 based on a detecting result from the computing portion 9. Meanwhile, although FIG. 4 shows only one of the linear switch 2a and the configuration of the detecting device 3 which corresponds to one of the linear switch 2a, since the present embodiment has two linear switches 2a, 2b, the steering switch device 1 has two configurations as with shown in FIG. 4.

Herein, a resistance of the first electrode wire 5a (the conductive layer 51) from the first pressing portion 7a to the second pressing portion 7b defines R1, a resistance of the first electrode wire 5a (the conductive layer 51) from the second pressing portion 7b to the third pressing portion 7c defines R2, and a resistance of the first electrode wire 5a (the conductive layer 51) from the third pressing portion 7c to the first pressing portion 7a defines R3.

In the detecting device 3, when anyone of the pressing portions 7a to 7c fails to be pressed, voltage V detected in the computing portion 9 is Vdd. Then, when anyone of the pressing portions 7a to 7c is pressed, since both electrode wires 5 contact each other and ground fault is produced at anyone of the pressed pressing portions 7a to 7c, the voltage V detected in the computing portion 9 changes by resistive dividing.

For example, if R1 is equal to R2, R3, and R4, the voltage V detected in the computing portion 9 is ($3/4$)·Vdd when the first pressing portion 7a is pressed, the voltage V detected in the computing portion 9 is ($2/3$)·Vdd when the second pressing portion 7b is pressed, and the voltage V detected in the computing portion 9 is ($1/2$)·Vdd when the third pressing portion 7c is pressed.

The computing portion 9 is configured so as to compare the detected voltage V and a predetermined threshold voltage, and detect which pressing portion 7a to 7c is pressed.

The control portion 10 carries out the operation which corresponds to the pressed pressing portion 7 based on a detecting result from the computing portion 9. The operations corresponding to the pressing portion 7 are, for example, such as an audio operation an air conditioner operation, or a cruise control switch control.

Next, a control flow in the computing portion 9 will be explained using FIG. 5.

Figure 5:
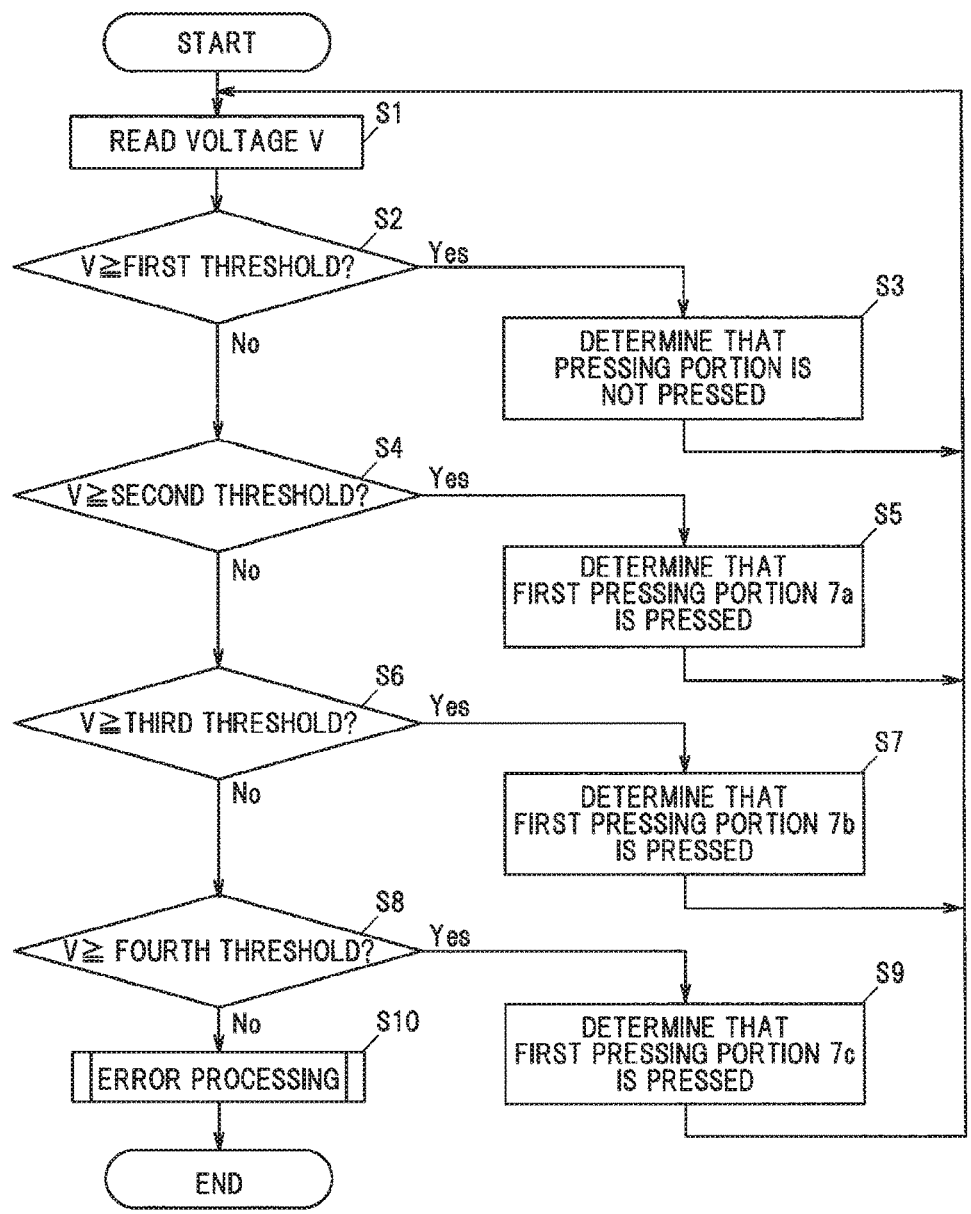
FIG. 5 is a flowchart showing a control flow of a computing portion.

As shown in FIG. 5, first, the computing portion 9 reads the voltage V (detects the voltage V) in step S1. Next, the computing portion 9 determines whether the detected voltage V is not less than the first threshold or not. The first threshold is set in less than the voltage Vdd which the power source 8 applies, and more than the voltage which is detected when the first pressing portion 7a is pressed (If R1 is equal to R2, R3, and R4, the first threshold is ($3/4$)·Vdd).

If the computing portion 9 determines "YES" in step S2, the computing portion 9 determines that anyone of the pressing portions 7a to 7c fails to be pressed in step S3 and returns to step S1.

If the computing portion 9 determines "NO" in step S2, the computing portion 9 determines whether the detected voltage V is not less than the second threshold or not in step S4. Meanwhile, the second threshold is set in less than the first threshold, and more than the voltage which is detected when the second pressing portion 7b is pressed (If R1 is equal to R2, R3, and R4, the second threshold is ($2/3$)·Vdd). If the computing portion 9 determines "YES" in step S4, the computing portion 9 determines that the first pressing portions 7a is pressed in step S5 and outputs a control signal which indicates that the first pressing portion 7a is pressed to the control portion 10. Then after outputting the control signal, the computing portion 9 returns to step S1.

If the computing portion 9 determines "NO" in step S4, the computing portion 9 determines whether the detected voltage V is not less than the third threshold or not in step S6. Meanwhile, the third threshold is set in less than the second threshold, and more than the voltage which is detected when the third pressing portion 7c is pressed (If R1 is equal to R2, R3, and R4, the third threshold is ($1/2$)·Vdd). If the computing portion 9 determines "YES" in step S6, the computing portion 9 determines that the second pressing portions 7b is pressed in step S7 and outputs a control signal which indicates that the second pressing portion 7b is pressed to the control portion 10. Then after outputting the control signal, the computing portion 9 returns to step S1.

If the computing portion 9 determines "NO" in step S6, the computing portion 9 determines whether the detected voltage V is not less than a fourth threshold or not in step S8. Meanwhile, the fourth threshold is set in less than the third threshold. If the computing portion 9 determines "YES" in step S8, the computing portion 9 determines that the third pressing portions 7c is pressed in step S9 and outputs a control signal which indicates that the third pressing portion 7c is pressed to the control portion 10. Then after outputting the control signal, the computing portion 9 returns to step S1.

If the computing portion 9 determines "NO" in step S8, the voltage V is abnormally small. Also, since a failure such as short circuit in the linear switch 2 or a wire between the linear switch 2 and the detecting device 3 is possibly to generate, the computing portion 9 processes an error processing such as warning in step 10 and finish the processing.

Meanwhile, it is not shown in FIG. 5, the computing portion 9 may be configured so as to output a control signal which indicates the pressing portions 7a to 7c are pressed to the control portion 10 when the pressing portions 7a to 7c are pressed continuously by the predetermined time. It is to suppress an unintentional switch control caused by pressing the pressing portion 7 by mistake in controlling the steering wheel 20.

Functions and Effects of the Embodiment

As described above, in the steering switch device 1 according to the present embodiment, the steering switch device 1 is provided with the linear switch 2, including the hollow insulator 4 having restorability, and two electrode wires 5, arranged spirally along the inner surface of the hollow part 4a in the hollow insulator 4 with maintaining non-contact each other, wherein the winding pitch P coiling spirally the electrode wires is at least not more than 10 mm; and the detecting device 3 detecting that the linear switch 2 is pressed by detecting a contact of the electrode wires 5, wherein the linear switch 2 is arranged so as to be along at least part of the surface of the steering wheel 20.

Comparing with a usual push switch which uses rubber contacting or spring etc. or a switch including the pressure sensor in the steering wheel 20, the linear switch 2 has simple configuration and less failure rate, and costs low. That is, the steering switch device 1 that has simple configuration and less failure rate, and costs low can be achieved using the linear switch 2.

Since the linear switch 2 can be transformed flexibly, the linear switch 20 can be used for the steering wheels 20 which have various shapes. Accordingly, the steering switch device 1 has versatility and fine mass-productivity. And the manufacturing cost of the steering switch device 1 can be reduced effectively.

Also, by the winding pitch P of the electrode wire 5 of the linear switch 5 being not more than 10 mm, the two electrode wires 5 can contact each other when the driver pushes the linear switch by the finger. Thus, a failure that the two electrode wires 5 fail to contact each other when the driver pushes the linear switch 2 can be suppressed.

Also, as described above, in the steering switch device 1 according to the present embodiment, a steering switch device 1, wherein at least the outermost layer of the two electrode wires 5 are made of the conductive layer that is made of conductive rubber or conductive plastic, wherein at least one of the two electrode wires 5 fails to have the conductor to conduct electrically the conductive layer 51 in the inside layer of the conductive layer 51, and wherein the detecting device 3 detects the change in the resistance value between each one end of the two electrode wires 5 in the one end of the linear switch 2 and detects the position that the linear switch 2 is pressed in the longitudinal direction of the linear switch 2.

Since a usual steering switch device which includes a pressure sensor in the steering wheel 20 needs to include a plurality of the pressure sensors in various sections of the steering wheel respectively to achieve multiple functions, the usual steering switch device is possibly to be complicated in structure and is possibly to cost higher. In contrast, since the steering switch device 1 is configured so as to be detectable the position which the linear switch 2 is pressed, multiple functions can be arranged by the pressing position of the linear switch 2, the steering switch device 1 can have same function which the switch that is arranged a plurality of the switches using only one linear switch 2. That is, in the present embodiment, the steering switch device 1 that has simple configuration and less failure rate, and costs low can be achieved using the linear switch 2.

Other Embodiments According to the Invention

In the embodiment described above, the steering switch device 1 which each of the pressing portions 7 has respective differential functions is explained. However, each of the pressing portions 7 can be configured so as to have same function. For example, an operation which the heater heats when one of the linear switches 2a is pressed and the heater cools when the other linear switch 2b is pressed can be carried out.

Specifically, as the steering switch device 60 shown in FIG. 6A, the steering switch device 60 is provided with an adder 61 which has two input terminals 61a, 61b to which each one end of the electrode wires 5 of the two linear switches 2a, 2b is connected electrically, to add an electrical signal input from the two input terminals 61a, 61b and output, an integrator 62 to integrate the output from the adder 61 and output, and an amplifier 63 to amplify the output from the integrator 62 and output, and can be configured such that the output from the amplifier 63 inputs into the heater 64 directly. A first power source 65 applies a positive voltage to the other end of the electrode wire 5 of the linear switch 2a. And a second power source 65 applies a negative voltage to the other end of the electrode wire 5 of the linear switch 2b. Meanwhile, the heater 64 is, for example, a sheet heater arranged in a sheet such as a driver's sheet.

FIG. 6B shows an operation when the linear switches 2a, 2b are pressed in FIG. 6A by a time chart style. Meanwhile, the Vs1 in FIG. 6B indicates the voltage at the input terminal 61a of the adder 61 (the output voltage from the linear switch 2a to the adder 61), the Vs2 indicates the voltage at the input terminal 61b of the adder 61 (the output voltage from the linear switch 2b to the adder 61).

As shown in FIG. 6B, when the pressing portion 7 of the linear switch 2a is pressed from the time t1, the positive voltage is applied to the input terminal 61a and the adder 61 outputs the positive voltage. Since the integrator 61 integrates the positive voltage output from the adder 61 while the linear switch 2a is pressed, the voltage output from the integrator 62 increases gradually. Due to the gradually increasing voltage which is output from the amplifier 63 and applied to the heater 64, the temperature of the heater 64 rises.

When pressing the linear switch 2a stops at the time t2, the voltage Vs1 at the input terminal 61a become 0V. Since the output voltage from the adder 61 also becomes 0V, the output voltage from the integrator 62 becomes a constant.

Then, when the pressing portion 7 in the linear switch 2b is pressed from the time t3, the negative voltage is applied to the input terminal 61b and the adder 61 outputs the negative voltage. Since the integrator 62 integrates the negative voltage output from the adder 61 while the linear switch 2b is pressed, the voltage output from the integrator 62 decreases gradually. Due to the gradually decreasing voltage which is output from the amplifier 63 and applied to the heater 64, the temperature of the heater 64 falls. When pressing the linear switch 2b stops at the time t4, the voltage Vs2 at the input terminal 61b becomes 0V and the output voltage in the adder 61 also becomes 0V, and the output voltage from the integrator 62 becomes a constant.

Since the steering switch device 60 shown in FIG. 6A generates an output signal for the heater 64 using the voltage output from the linear switches 2a, 2b, the computing portion 9 and the control portion 10 shown in FIG. 4 can be omitted. Thus, the steering switch device 60 which has simpler configuration and costs lower can be achieved.

Figure 7:
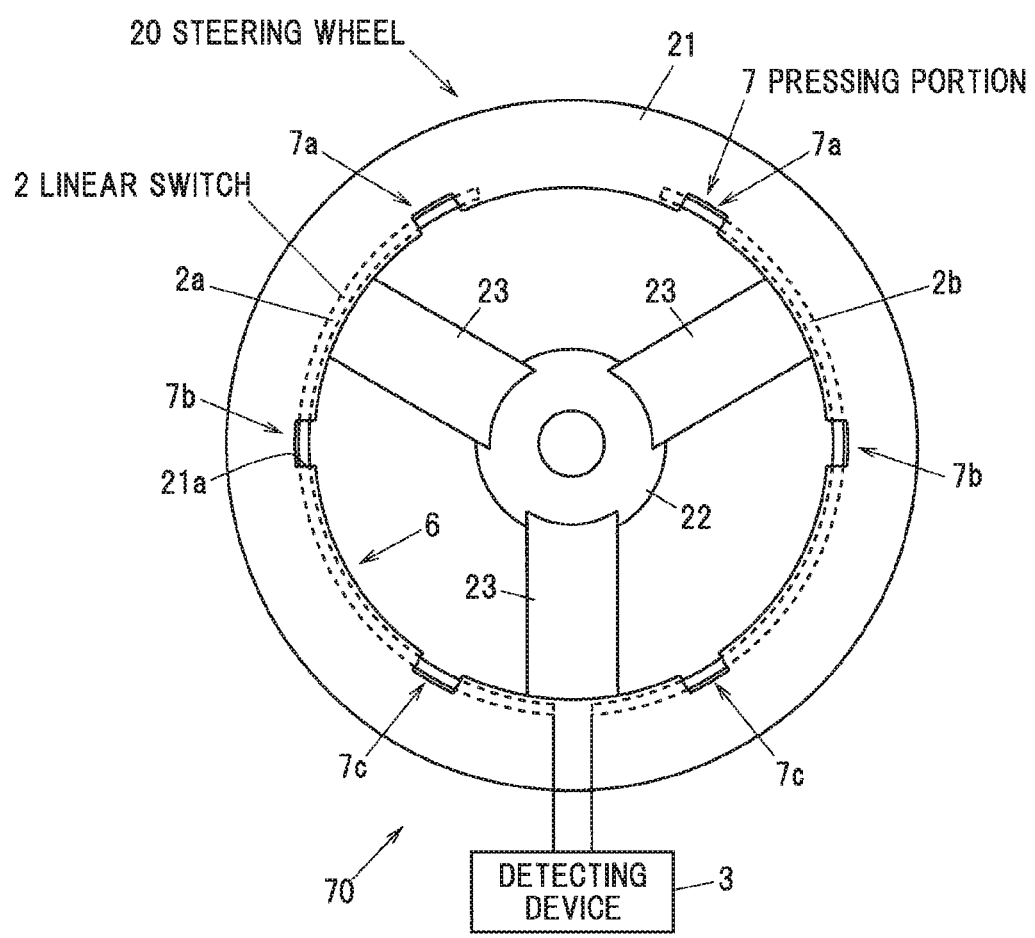
FIG. 7 is a plan view showing a steering wheel that mounts a steering switch device wheel in another embodiment according to the invention.

The steering switch device 70 shown in FIG. 7 is as the steering switch device 1 shown in FIG. 1 which the linear switch 2 is arranged along an inner peripheral surface of the steering wheel main body 21. By arranging the linear switch 2 along the inner peripheral surface of the steering wheel main body 21, since the cutout 21a configuring the pressing portion 7 opens inside, the cutout 21a hardly interferes the driver's finger and can prevent the driver from decreasing usability of the steering wheel 20 even if the driver rotates the steering wheel 20 with the driver placing the driver's hand on the steering wheel main body 21, for example, when the vehicle restores from the curve to the straight.

Meanwhile, the inner peripheral surface of the steering main body 21 means the innermost surface in the outer surface of the steering wheel main body 21. Also, "arranging the linear switch 2 along the inner peripheral surface of the steering wheel main body 21" means only that the linear switch 2 arranged along the inner peripheral surface and the linear switch 2 need not contact actually on the inner surface. That is, the linear switch 2 may be arranged at an outer periphery side of the inner peripheral surface or so as to project into the inner of the inner peripheral surface.

In the steering switch device 70, since it is assumed that the driver presses the pressing portion 7 by a thumb, a width of the cutout 21a is more preferable to be not less than 20 mm.

Figure 8A:
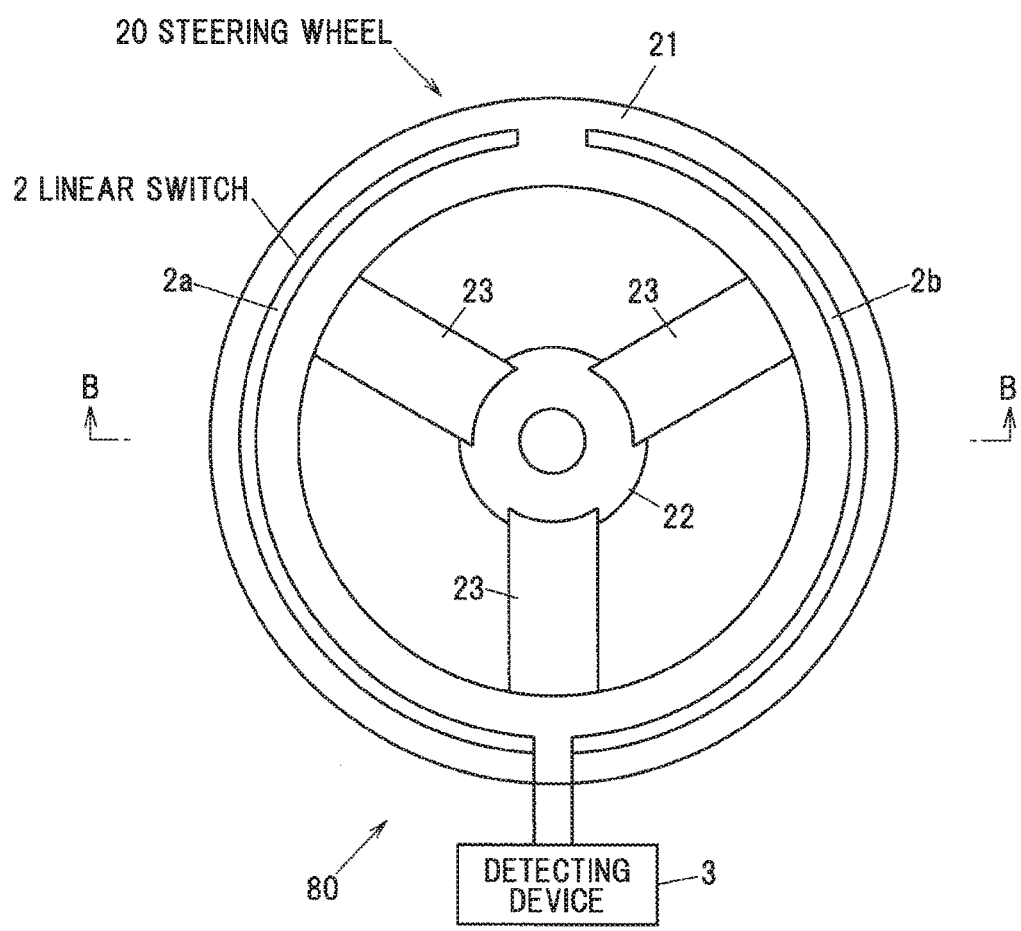
FIG. 8A is a plan view showing a steering wheel that mounts a steering switch device wheel in another embodiment according to the invention.
Figure 8B:
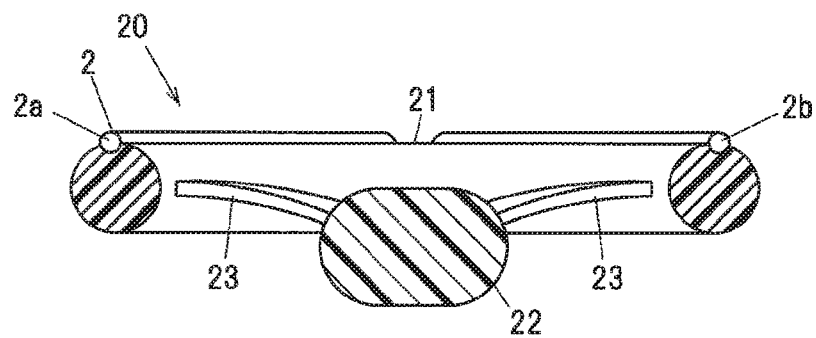
FIG. 8B is a cross sectional view cut along a line B-B in FIG. 8A.

The steering switch device 80 shown in FIGS. 8A, 8B is as the steering switch device 1 shown in FIG. 1 that the linear switch 2 is arranged at a center portion of the steering main body 21 in a radial direction so as to project from the steering main body 21 into upper (the driver side). The steering switch device 80 omits the sensor cover 6 to cover the linear switch 2 and is configured such that the linear switch 2 can be pressed at any position in the longitudinal direction.

As with the steering switch device 80, the linear switch 2 may be exposed over the nearly entire length with the sensor cover 6 being omitted. In this case, for example, by setting a plurality of sections along the longitudinal direction of the linear switch 2 and detecting which section of the linear switch 2 is pressed using the detecting device 3, multiple functions can be achieved. Also, for example, the steering switch device 80 can be configured such that a volume of the car audio and a desired temperature of the air conditioner etc. can operate continuously corresponding to the detected pressing position of the linear switch 2 in the detecting device 3.

Figure 9:
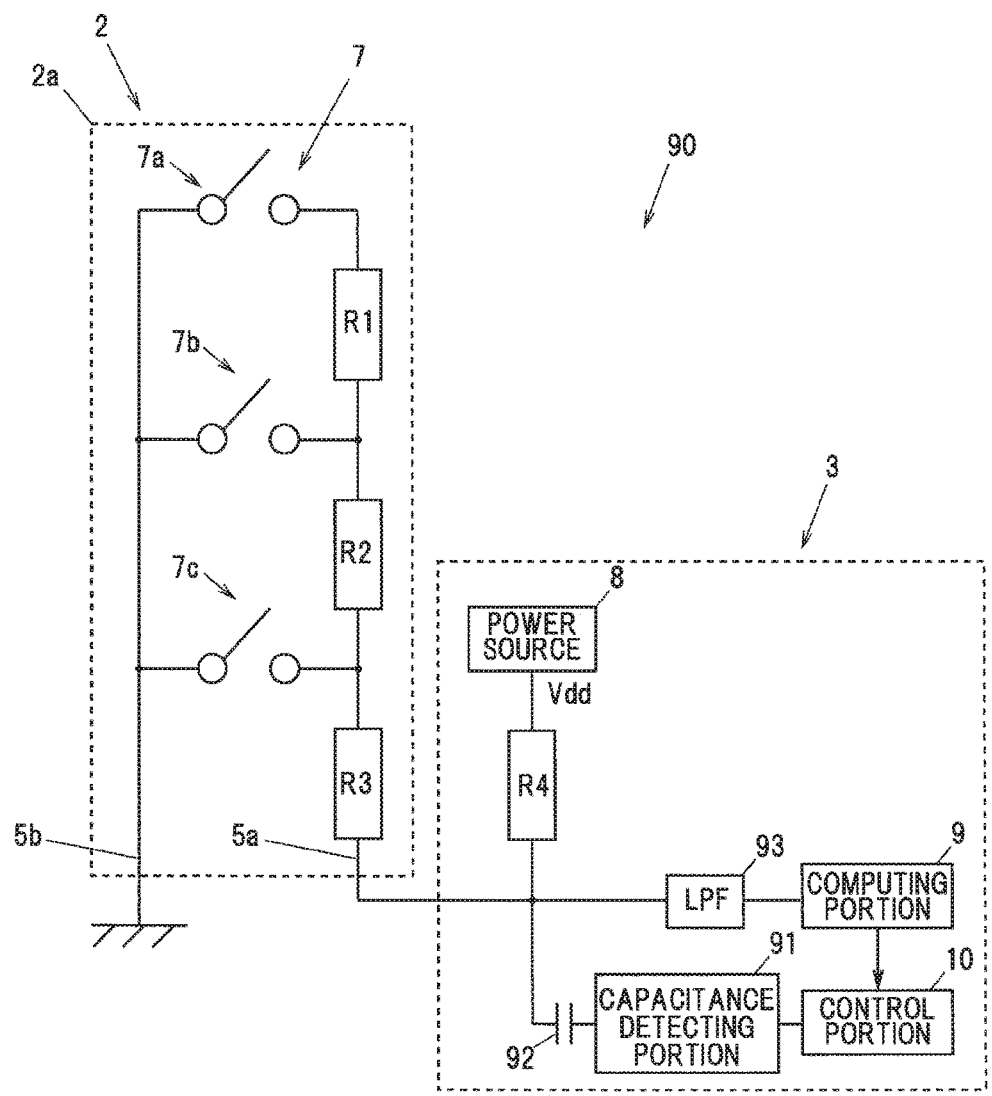
FIG. 9 is an explanatory diagram showing a schematic configuration of steering switch device in another embodiment according to the invention.

The steering switch device 90 shown in FIG. 9 is additionally provided with a capacitance detecting portion 91 to detect capacitance between the two electrode wires 5 of the linear switch 2 for the detecting device 3.

When the driver holds the steering wheel main body 21 by the driver's hand, because of an effect caused by stray capacitance between the driver's hand and the electrode wire 5, the capacitance detected at the capacitance detecting portion 91 increases comparing with the driver not holding the steering wheel main body 21. Thus, by monitoring the capacitance between the two electrode wires 5 using the capacitance detecting portion 91, whether the driver holds the steering wheel body 21 or not (whether the driver's hand contacts the steering wheel main body 21 or not) can be detected.

The capacitance detecting portion 91 has a circuit configuration to detect the regular capacitance C between the two electrode wires 5 and capacitance (C+ΔC) that is added the stray capacitance ΔC which is generated when a human body closes to the linear switch 2, and output a detecting signal to the control portion 10 when the increase of the stray capacitance ΔC is detected. For example, the control portion 10 can warn to the driver by using sound or light beam and urge the driver to drive safely when the vehicle runs and the driver fails to hold the steering wheel main body 21.

The capacitance detecting portion 91 is configured so as to detect the capacitance using, for example, the auto balance bridge method. In this case, since an alternative current signal is applied through the electrode wires 5, a low pass filter (LPF) 93 to cut the alternative current signal is arranged at a front stage of the computing portion 9. Also, to control the effect for the capacitance detecting portion 91 caused by the direct current signal from the power source 8, a capacitance element 92 to cut the direct current signal is arranged at a front stage of the capacitance detecting portion 91.

SUMMARY OF THE EMBODIMENTS

Next, technical ideas understood from the embodiments as described above will be described below with using the reference numerals, etc., used in the description of the embodiments. However, each reference numeral, etc., described below is not intended to limit the constituent elements in the claims to the members, etc., specifically described in the embodiments.

[1] A steering switch device (1), which is mounted on a steering wheel (20), comprising:

a linear switch (2) that comprises a hollow insulator (4) having restorability and two electrode wires (5) arranged spirally along an inner surface of a hollow part (4a) in the hollow insulator (4) while being kept not in contact with each other, wherein a winding pitch coiling spirally the electrode wires (5) is at least not more than 10 mm; and a detecting device (3) that detects a press of the linear switch (2) by sensing a contact of the electrode wires (5), wherein the linear switch (2) is arranged so as to be along at least part of a surface of the steering wheel (20).

[2] The steering switch device (1) according to [1], wherein at least an outermost layer of the two electrode wires (5) comprises a conductive layer (51) comprising a conductive rubber or a conductive plastic, wherein at least one of the two electrode wires (5) has no conductor to be electrically connected to the conductive layer (51) in an inside layer of the conductive layer (51), and wherein the detecting device (3) detects a change in a resistance value between each one end of the two electrode wires (5) in an one end of the linear switch (2) and detects a position that the linear switch (2) is pressed in a longitudinal direction of the linear switch (2).

[3] The steering switch device (1) according to [2], wherein one of the two electrode wires (5) comprises an enameled wire (52) and the conductive layer (51) formed on an outer periphery of the enameled wire (52), and wherein the other one of the two electrode wires (5) comprises a conductor (53) and the conductive layer (51) formed on an outer periphery of the conductor (53).

[4] The steering switch device (1) according to [1], wherein the steering wheel (20) comprises a circular steering wheel main body (21), a coupling portion (22) arranged on an central axis of the steering wheel main body (21), and a spoke portion (23) arranged between the coupling portion (22) and the steering wheel main body (21), and wherein the linear switch (2) is arranged along a circumferential direction of the steering wheel main body (21) so as to be along at least part of a surface of the steering wheel main body (21).

The steering switch device (70) according to [4], wherein the linear switch (2) is arranged so as to be along an inner peripheral surface of the steering wheel main body (21).

[6] The steering switch device (1) according to claim 1, wherein the linear switch comprises a plurality of linear switches (2), wherein the plurality of the linear switches (2) are arranged separately at different positions in the steering wheel (20).

[7] The steering switch device (1) according to [1], further comprising a sensor cover (6) that covers the linear switch (2) and has rigidity, wherein the sensor cover (6) comprises a plurality of pressing portions (7) where a press of the linear switch (2) is allowed, the pressing portions being arranged separately in a longitudinal direction of the linear switch (2).

[8] The steering switch device (1) according to [7], wherein the pressing portions (7) comprise a notch or an opening (21a) formed on the sensor cover (6).

[9] The steering switch device (90) according to [1], further comprising a capacitance detecting portion (91) to detect a capacitance between the electrode wires (5).

[10] A steering wheel (20), comprising the steering switch device (1) according to [1].

Although the embodiments of the invention have been described, the invention is not to be limited to the embodiments. Meanwhile, it should be noted that all combinations of the features described in the embodiments are not necessary to solve the problem of the invention.

Also, the various kinds of modifications can be implemented without departing from the gist of the invention.

For example, in the above embodiment only the steering switch device according to the present invention is arranged in the steering wheel 20. However, the steering wheel may use simultaneously the usually used switch device such as the push switch which uses rubber contacting and spring etc.

Although in the above embodiment the linear switch 2 is arranged in the steering wheel main body 21, the linear switch 2 may be arranged at the spoke portion 23 or the coupling portion 22.

Also, in the present embodiment, the opposite side end (the other end) that oppose the connected sides for the detecting device 3 of the two electrode wires 5 is opened. It is not limited to thereof, for example, both of the other ends of the two electrode wires 5 may be connected electrically each other via a resistance element. In this case, the detecting device 3 may be provided with a disconnection detecting portion that monitors an electric current flowing through the two electrode wires 5 and detects the disconnection at the electrode wire 5 or the wire that connects the electrode wire 5 and the detecting device 3 when the electric current is not more than the predetermined threshold.

What is claimed is:

1. A steering switch device, which is mounted on a steering wheel, the steering switch device comprising:
    a linear switch that comprises a hollow insulator having restorability and two electrode wires arranged spirally along an inner surface of a hollow part in the hollow insulator while being kept not in contact with each other, wherein a winding pitch coiling spirally the electrode wires is not more than 10 mm; and
    a detecting device that detects a press of the linear switch by sensing a contact of the electrode wires,
    wherein the linear switch is arranged so as to be along at least a part of a surface of the steering wheel.

2. The steering switch device according to claim 1, wherein the linear switch comprises a plurality of linear switches, and
    wherein the plurality of the linear switches are arranged separately at different positions in the steering wheel.

3. The steering switch device according to claim 1, further comprising a capacitance detecting portion to detect a capacitance between the electrode wires.

4. A steering wheel, comprising the steering switch device according to claim 1.

5. The steering switch device according to claim 1, wherein at least an outermost layer of the two electrode wires comprises a conductive layer comprising a conductive rubber or a conductive plastic,
    wherein at least one of the two electrode wires has no conductor to be electrically connected to the conductive layer in an inside layer of the conductive layer, and
    wherein the detecting device detects a change in a resistance value between ends of the two electrode wires at one end of the linear switch and detects a position that the linear switch is pressed in a longitudinal direction of the linear switch.

6. The steering switch device according to claim 5, wherein one of the two electrode wires comprises an enameled wire and the conductive layer formed on an outer periphery of the enameled wire, and
    wherein an other one of the two electrode wires comprises a conductor, and the conductive layer formed on an outer periphery of the conductor.

7. The steering switch device according to claim 1, wherein the steering wheel comprises a circular steering wheel main body, a coupling portion arranged on an central axis of the steering wheel main body, and a spoke portion arranged between the coupling portion and the steering wheel main body, and
    wherein the linear switch is arranged along a circumferential direction of the steering wheel main body so as to be along at least part of a surface of the steering wheel main body.

8. The steering switch device according to claim 7, wherein the linear switch is arranged so as to be along an inner peripheral surface of the steering wheel main body.

9. The steering switch device according to claim 1, further comprising a sensor cover that covers the linear switch and has rigidity,
    wherein the sensor cover comprises a plurality of pressing portions where a press of the linear switch is allowed, the pressing portions being arranged separately in a longitudinal direction of the linear switch.

10. The steering switch device according to claim 9, wherein the pressing portions comprise a notch or an opening formed on the sensor cover.

11. A steering switch device, which is mounted on a steering wheel, the steering switch device comprising:
    a linear switch that comprises a hollow insulator having restorability and two electrode wires arranged spirally along an inner surface of a hollow part in the hollow insulator while being kept not in contact with each other; and
    a detecting device that detects a press of the linear switch by sensing a contact of the electrode wires,
    wherein the linear switch is arranged so as to be along at least a part of a surface of the steering wheel.

12. The steering switch device according to claim 11, wherein the linear switch comprises a plurality of linear switches, and
    wherein the plurality of the linear switches are arranged separately at different positions in the steering wheel.

13. The steering switch device according to claim 11, further comprising a capacitance detecting portion to detect a capacitance between the electrode wires.

14. A steering wheel, comprising the steering switch device according to claim 11.

15. The steering switch device according to claim 11, wherein at least an outermost layer of the two electrode wires comprises a conductive layer comprising a conductive rubber or a conductive plastic,
    wherein at least one of the two electrode wires has no conductor to be electrically connected to the conductive layer in an inside layer of the conductive layer, and
    wherein the detecting device detects a change in a resistance value between ends of the two electrode wires at one end of the linear switch and detects a position that the linear switch is pressed in a longitudinal direction of the linear switch.

16. The steering switch device according to claim 15, wherein one of the two electrode wires comprises an enameled wire and the conductive layer formed on an outer periphery of the enameled wire, and wherein an other one of the two electrode wires comprises a conductor, and the conductive layer formed on an outer periphery of the conductor.

17. The steering switch device according to claim 11, wherein the steering wheel comprises a circular steering wheel main body, a coupling portion arranged on an central axis of the steering wheel main body, and a spoke portion arranged between the coupling portion and the steering wheel main body, and wherein the linear switch is arranged along a circumferential direction of the steering wheel main body so as to be along at least part of a surface of the steering wheel main body.

18. The steering switch device according to claim 17, wherein the linear switch is arranged so as to be along an inner peripheral surface of the steering wheel main body.

19. The steering switch device according to claim 11, further comprising a sensor cover that covers the linear switch and has rigidity, wherein the sensor cover comprises a plurality of pressing portions where a press of the linear switch is allowed, the pressing portions being arranged separately in a longitudinal direction of the linear switch.

20. The steering switch device according to claim 19, wherein the pressing portions comprise a notch or an opening formed on the sensor cover.

* * * * *